Nov. 12, 1968 F. M. PERRA 3,411,098

VARIABLE Q. NOTCHED FILTER

Filed Oct. 22, 1965 3 Sheets-Sheet 1

INVENTOR

Frank M. Perra

BY Stevens, Davis, Miller & Mosher

ATTORNEYS

INVENTOR
Frank M. Perra
BY
Stevens, Davis, Miller & Mosher
ATTORNEYS

INVENTOR
Frank M. Perra

BY Stevens, Davis, Miller & Mosher
ATTORNEYS

United States Patent Office 3,411,098
Patented Nov. 12, 1968

3,411,098
VARIABLE Q NOTCHED FILTER

Frank M. Perra, Laurel, Md., assignor to Halliburton Company, Duncan, Okla., a corporation of Delaware
Filed Oct. 22, 1965, Ser. No. 501,126
9 Claims. (Cl. 330—26)

Figure 1:
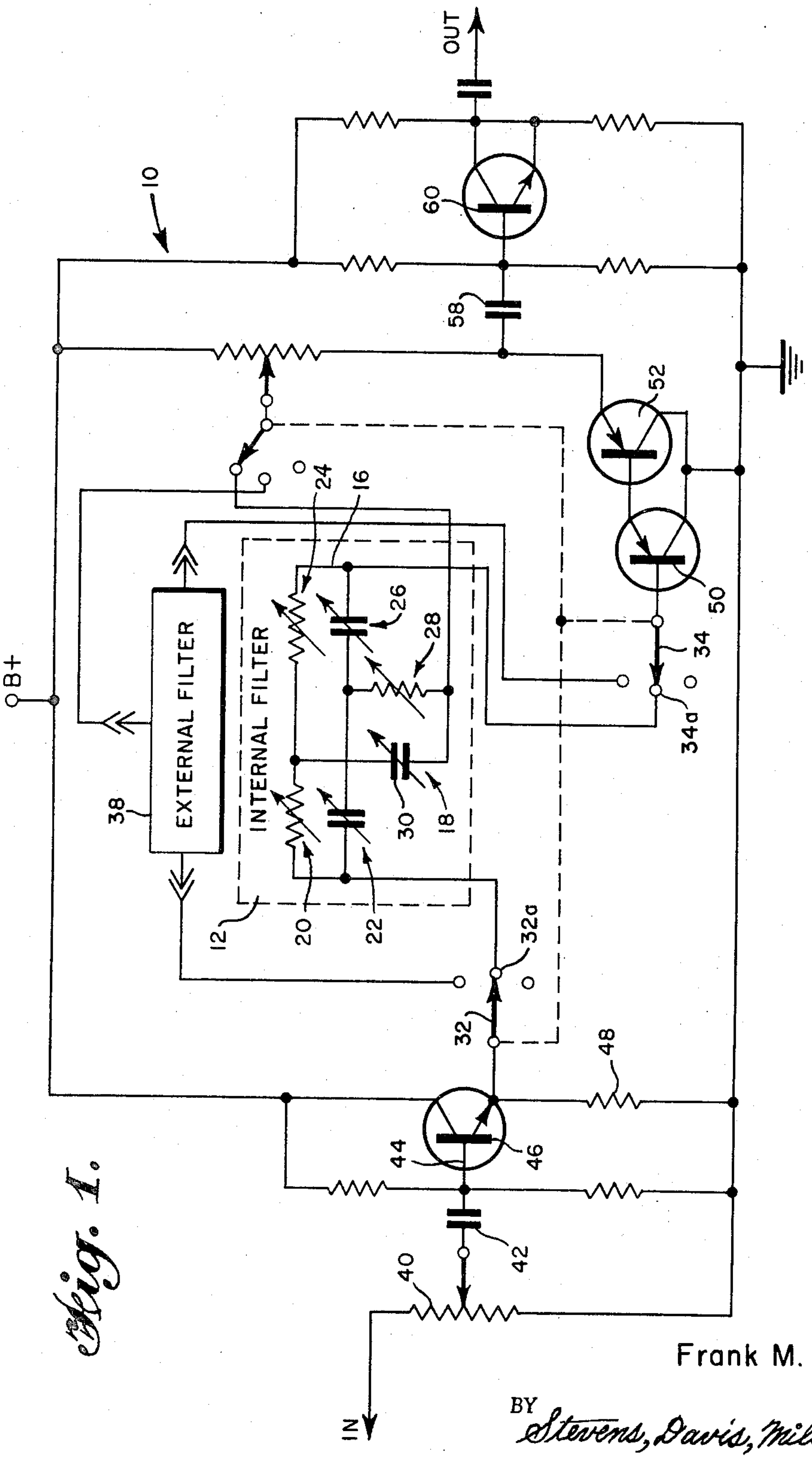

This invention relates to a filter circuit which has improved characteristics of passing all frequencies except the frequency which it is designed to reject. More particularly, the invention provides a parallel-T filter with a variable Q capability in order to give the sharpest response curve for any given frequency of interest.

As used herein, the following definition is given to the term Q:

$$Q=\frac{F_0}{F_2-F_1}$$

Wherein $F_0$ is the tuned frequency which the filter is designed to reject and the term $F_2-F_1$ is the difference between the frequencies of the attenuation characteristic curve at the —3 db level.

Parallel-T filter networks have been known for some time and as evidenced by U.S. Patent No. 3,009,121, the rejection frequency can be adjusted by incorporating variable resistors and capacitors in the filter section. However, because the Q of each of these prior networks is constant, the filter will not operate at the same efficiency for one frequency setting as it would for another frequency setting.

Therefore, it is a primary object of the present invention to overcome said aforementioned problem by improving the selectivity of a notch filter by varying the Q thereof and setting the same to maximum regardless of the frequency designed to be blocked by the network. In accordance with the present invention, a network is provided which has a filter section capable of passing all but a predetermined frequency signal and having an input arm, an output arm and an intermediate arm; an input circuit is connected to said input arm; an output circuit is connected to said output arm and adapted to develop therein a signal in phase with the signal on said output arm; and wherein the intermediate arm is connected to a load resistor so that a portion of the output signal is fed back (positive feed back) to the parallel-T filter section. Thus, after the predetermined frequency is set in the filter by changing the resistance-capacitance values thereof, the Q of the circuit is increased by adjusting the value of the feed back signal until maximum Q of the circuit is attained.

Another object of the present invention is to provide an amplifier stage coupled to receive the output of the filter section and comprising a pair of transistors arranged in a Darlington compound configuration with the feed back voltage taken across the load resistor thereof. With this arrangement, the amplifier stage affords a high input impedance and low output impedance in order to avoid undue signal loss. Moreover, the Darlington amplifier maintains stability and prevents filter oscillation because the gain of this amplifier stage is always less than unity.

Yet another object of the present invention is to provide an emitter follower in the input circuit connected to the input arm of the filter section, said emitter follower presenting high output impedance for maintaining the signal level.

Another important feature of the present invention is to provide variable resistors and capacitors in the input and output arms of the filter section, the resistors being ganged and the capacitors being ganged so that the values thereof are at all times the same. The resistance of the intermediate arm is independently variable within the fine tuning range. These resistors and capacitors are in the form of a bank of resistors and capacitors each with an electric switch contact and a movable step switch associated therewith positionable to contact one of said bank of resistors or capacitors.

Still another feature of the present invention is a ganged switch arrangement which is adapted to simultaneously switch the internal filter section out and an external filter section directly in circuit with the overall filter network.

Figure 2:
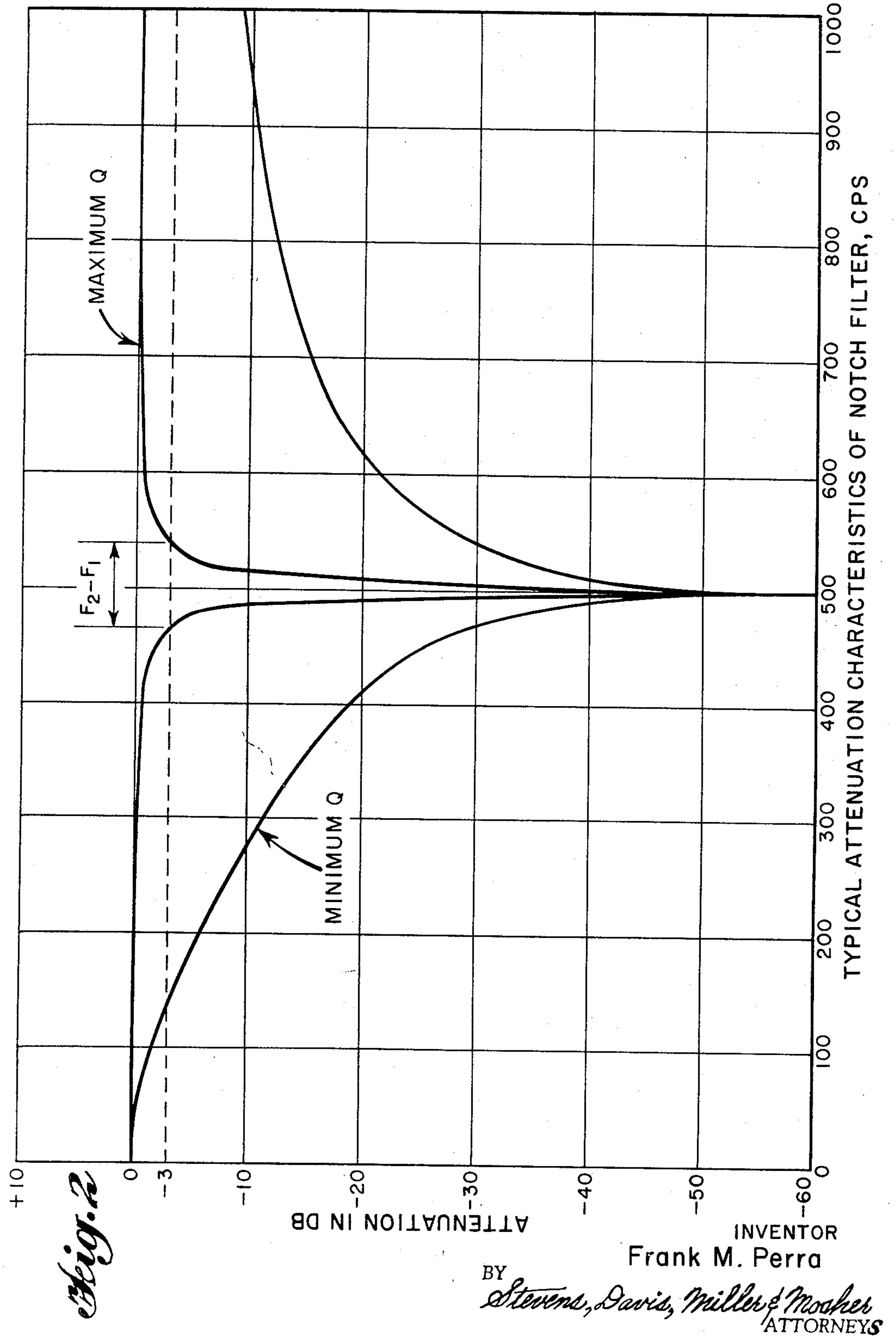
Figure 3:
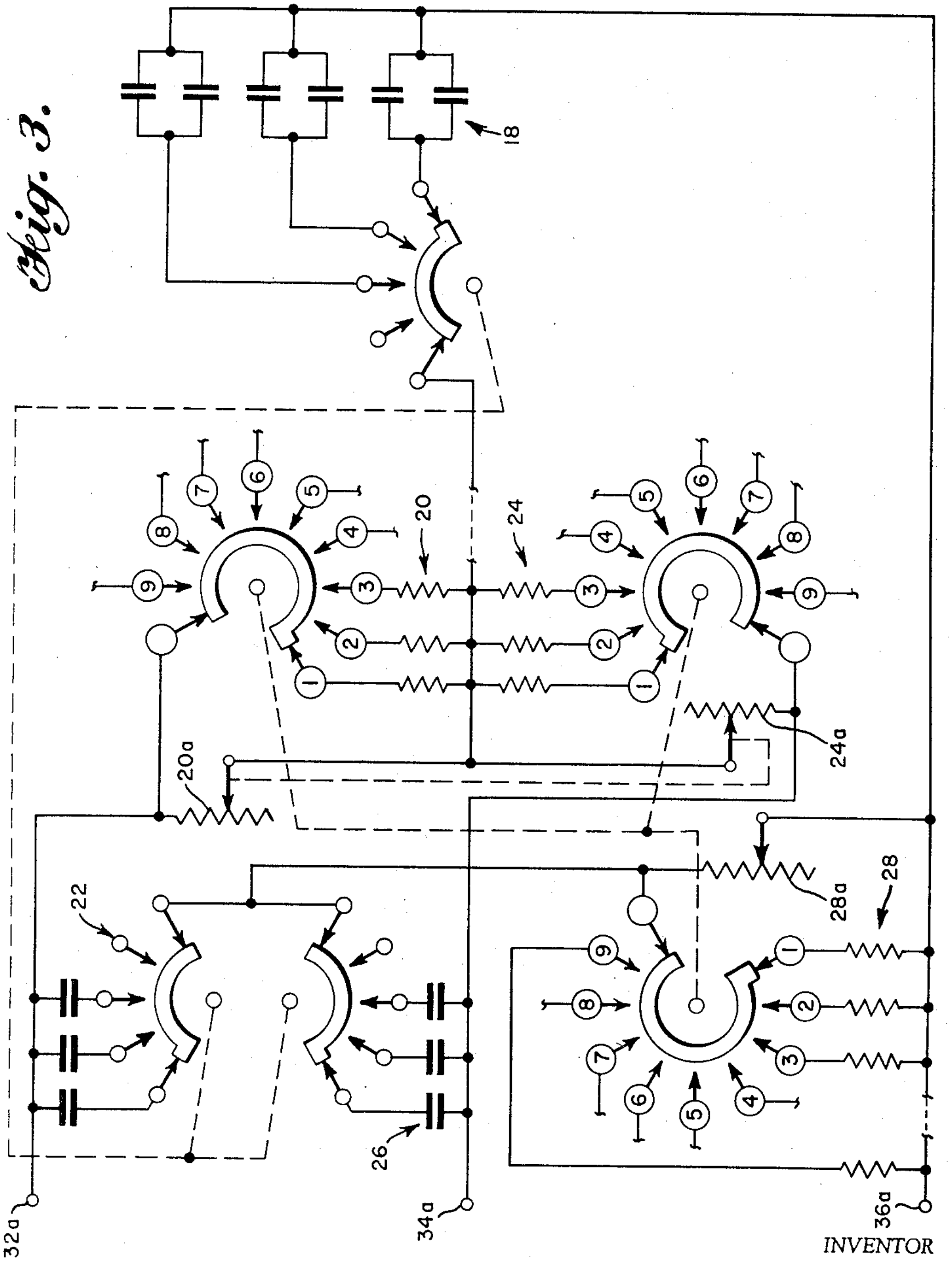

Other and further objects of the present invention will become apparent with the following detailed description when taken in view of the appended drawings in which:

FIGURE 1 is a schematic illustration of the overall filter network which comprises one example of the present invention, FIGURE 2 is an attenuation characteristic curve of the notched filter network comprising the present invention, FIGURE 3 is a schematic illustration of the variable resistors and capacitors of the internal filter section of FIGURE 1.

Referring now to the drawings in detail, there is illustrated generally a notched filter network generally indicated as 10 having an internal filter section 12 which includes an input arm 14, an output arm 16 and an intermediate arm 18. Each of these arms has a variable resistance and capacitance in parallel which are more fully described in reference to FIGURE 3.

The input arm 14 is connected to one terminal of switch 32 and output arm 16 is connected to one terminal of switch 34 while the intermediate arm 18 is connected to one terminal of switch 36. As is apparent from FIGURE 1, switches 32, 34 and 36 are mechanically connected and in the event an external filter section is to be used in filter network 10, switches 32, 34 and 36 need only be switched to their respective step terminals connected to external jacks and external filter section 38. In this way, fixed single frequency rejection filters can be conveniently used in the network particularly where certain known frequencies are used repeatedly. These external filter sections may be fabricated as needed to supplement the tunable internal filter and filter network.

The internal filter of the present invention is shown in greater detail in FIGURE 3 and it can be seen that variable capacitors 18, 22 and 26 each comprise a bank of capacitors having progressively differing values and each having an electric contact which is engaged by a respective step switch contact arm so that any one of the bank of capacitors can be chosen as part of the internal filter. The step switch contact arms of capacitors 18, 22 and 26 are ganged or otherwise mechanically coupled together so that the in circuit values of these capacitors are simultaneously changed to predetermined fixed values. Thus, the in circuit values of capacitors 22 and 26 are at all times equal.

A similar bank arrangement is provided for resistors 20, 24 and 28 and there again the step switch contact arms are mechanically connected together so as to simultaneously move between resistors of predetermined set values. However, the banks of resistors 20, 24 and 28 are only used for range selection or coarse tuning, and, as can be seen in the figure, variable resistors 20*a*, 24*a*, and 28*a* are connected in parallel with resistor banks 20, 24 and 28 respectively. These variable resistors provide for fine tuning control. Resistors 20*a* and 24*a* are mechanically connected so that their value is at all times equal, but resistor 28*a* is independently controlled so that optimum rejection can be set into the internal filter section.

It should be understood that any desired number of capacitor and resistor components can be used in the respective banks and the number shown in FIGURE 3 is by way of example only. In one known example of the present invention, tuning is possible from 1 c.p.s. to 1.0 k.c.p.s. in three ranges:

| | C.p.s. |
|---|---|
| First range | 1 to 10 |
| Second range | 10 to 100 |
| Third range | 100 to 1,000 |

The range frequencies are selected by positioning the contact arms for capacitors 18, 22 and 26 while coarse frequency selection is accomplished by switching contact arms of resistors 20, 24 and 28. Fine tuning for selecting the exact frequency within the range is accomplished by adjusting resistors 20*a* and 24*a*, and 28*a*. It may be necessary to alternately adjust the settings of resistors 20*a* and 24*a* and (independently) resistor 28*a* in order to close in on the exact frequency of interest.

Referring again to FIGURE 1, the input signal is developed across a potentiometer 40 which provides gain control for the network and a portion of the input signal is fed through blocking capacitor 42 and then into the base or control electrode 44 of transistor 46. Thus, this input amplifier stage is designed as an emitter follower in order to achieve high input impedance and low output impedance.

The output of transistor 46 is connected through switch 32, internal filter section 12, switch 34, to the base of transistor 50 which is connected to transistor 52 to form a Darlington compound configuration. The load resistor 54 for the Darlington amplifier stage is connected to the emitter electrode of the last cascaded transistor 52. The output thereof across resistor 54 is in phase with the signal fed to the base of the first transistor 52.

The common terminal of the intermediate arm of the internal filter section, instead of being connected to ground, is connected to the movable potentiometer wiper arm 56 through switch 36 and in this way a portion of the output signal across resistor 54 is fed back to the intermediate arm of the filter section. Again, due to the phase relationships this is a positive feed back through switch 36.

Blocking capacitor 58 connects the output of the Darlington amplifier stage to an output amplifier 60 which provides the necessary gain to compensate for any losses due to loading at the input and output of the filter section.

The tuning procedure and effect of positive feed back at the intermediate leg of the filter section will now be described. The parallel-T filter section passes all frequencies, except the frequency which it is designed to reject. After setting the gain control (resistor 40) to midpoint, the frequency of this rejected signal is selected by first setting arm 56 to its lowest position and establish minimum Q. Next, the rejected frequency is selected in the manner described above. However, even if the rejected frequency is accurately set in the filter section, the selectivity thereof is normally not great and the filter section would have a tendency to block signals whose frequency is slightly above or below the designed rejected frequency. This is evident from the minimum Q curve of FIGURE 2 and, for example, if the designed frequency to be blocked is 500 cycles per second it can be seen that a 400 cycle signal is also greatly attenuated.

However, with the present invention, after the exact rejected frequency is set in the filter section, the mouth of the notch of the response curve is narrowed by varying the amount of feed back to the filter intermediate arm 18 by moving the wiper arm 56. This adjustment improves the Q of the filter section and makes the same more selective regarding the frequency of signals blocked. It can be seen in FIGURE 2 that with a maximum Q set in the filter section, only the 500 cycles per second signal is blocked. One example of the present invention has been made so that the filter section is sensitive to one cycle per second. In some cases, it might be necessary to readjust the fine tuning controls after establishing maximum Q.

Now, if a different signal, for example a 700 cycle signal, is to be blocked, Q is reduced and the new $F_0$ selected by resetting the various resistive and capacitive components of the input, output and intermediate arms of the filter section. Thereafter, the Q of the filter section is again improved by readjusting the potentiometer arm 56 to select the optimum positive feed back to the filter.

Observations of signal magnitude and waveforms can be done with the known use of a conventional signal generator, oscilloscope and voltmeter.

After the filter section is tuned in the manner described above, the gain control is reset (if desired) and the network is connected in circuit. Signals of all frequencies, except the notch frequency, pass through the network and appear at the output of amplifier 60.

It should be understood that the various modifications can be made to the presently disclosed example without departing from the spirit and scope of the present invention. Moreover, although frequencies have been mentioned in the audio range, it should be understood that the disclosed invention may apply to higher frequencies.

What is claimed is:

1. A variable Q notch filter comprising a parallel-T filter section which passes all but a predetermined frequency signal and having an input arm, an output arm, and an intermediate arm, an input circuit connected to said input arm, means coupled to said output arm for developing a signal in phase with the signal on said output arm, said intermediate arm connected to said means so that a portion of the in phase signal is fed back to the parallel-T filter section.

2. A filter as set forth in claim 1, wherein said means comprises a resistor across which the in phase signal is developed and wherein said intermediate arm is connected to said resistor, the connection therebetween being adjustable so that the magnitude of feedback is variable to control the Q of the filter.

3. A filter as set forth in claim 2, further comprising a semiconductor amplifier stage connected to said output arm having a high input impedance and a low output impedance, said resistor being connected as the load resistor of said amplifier stage and said amplifier stage having an amplification factor of less than unity.

4. A filter as set forth in claim 3, wherein said amplifier stage is a Darlington transistor compound and said resistor being connected to the output emitter of the last transistor, the base of the last transistor being connected to the emitter of the preceding one, the transistor collectors of said compound being connected to ground, and the base of the first transistor being connected to said output arm.

5. A filter as set forth in claim 4, wherein said input circuit comprises an emitter follower connected to said input arm.

6. A filter as set forth in claim 5, further comprising three ganged switches for simultaneously connecting the input, output and intermediate arms of an external filter to the emitter follower, amplifier stage and said base of the first transistor respectively.

7. A filter as set forth in claim 3, wherein each filter section arm has a variable resistor and capacitor connected to a common terminal, the resistors of the input and output arms being connected, the capacitors of the input and output arms being connected, the intermediate arm resistor being connected to the connection between said input and output capacitors, and the intermediate arm capacitor being connected to the connection between the resistors of said input and output arms, first means for ganging said resistors of said filter arms for coarse tuning adjustment, second means for ganging said resistors of said input and output arms for fine tuning adjustment, third means for independently varying said intermediate arm resistor for fine tuning adjustment, and fourth means for ganging said input, output and intermediate capacitors for selecting the filter frequency range of interest.

8. A filter as set forth in claim 7, wherein the resistors and capacitors of said filter section each comprises a plurality of electric elements of progressively differing values and each having an electric contact, a movable step switch arm adapted to engage only one contact at a time depending upon the setting thereof.

9. A filter as set forth in claim 8, wherein said resistors of said filter section further comprise further resistors each in parallel with one of said plurality of electric elements and said second means connected to the further resistors of said input and output resistors, said third means connected to said further resistor of said intermediate resistor and said first means connected to each said movable step switch arm.

References Cited

UNITED STATES PATENTS 3,271,693 9/1966 Nicholson ---------- 330—31

JOHN KOMINSKI, *Primary Examiner.*